United States Patent
Min et al.

(10) Patent No.: US 10,178,769 B2
(45) Date of Patent: Jan. 8, 2019

(54) BONDED ASSEMBLY AND DISPLAY DEVICE INCLUDING THE SAME

(71) Applicant: Samsung Display Co., Ltd., Yongin-si (KR)

(72) Inventors: Jin Sic Min, Busan (KR); Eun Cheol Son, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 4 days.

(21) Appl. No.: 15/581,923

(22) Filed: Apr. 28, 2017

(65) Prior Publication Data

US 2018/0063956 A1    Mar. 1, 2018

(30) Foreign Application Priority Data

Aug. 26, 2016 (KR) .................... 10-2016-0109217

(51) Int. Cl.
*H05K 1/11* (2006.01)
*H05K 1/14* (2006.01)
(Continued)

(52) U.S. Cl.
CPC ............. *H05K 1/144* (2013.01); *H01L 24/17* (2013.01); *H01L 24/32* (2013.01); *H01L 24/73* (2013.01);
(Continued)

(58) Field of Classification Search
CPC ... H05K 2201/0129; H05K 2201/0195; H05K 2201/023; H05K 2201/0239; H05K 3/321;
(Continued)

(56) References Cited

U.S. PATENT DOCUMENTS

2002/0109814 A1* 8/2002 Murahashi .......... G02F 1/13452
349/151
2006/0192915 A1* 8/2006 Kimura ................. G02F 1/1339
349/151
(Continued)

FOREIGN PATENT DOCUMENTS

JP      2014-103183     6/2014
KR      10-0306115      3/2002
(Continued)

*Primary Examiner* — Pete T Lee
(74) *Attorney, Agent, or Firm* — H.C. Park & Associates, PLC

(57) ABSTRACT

A bonded assembly including: a first electronic component including a first substrate and a plurality of first electrodes disposed in a pressed area at a first height from a surface of the first substrate; a second electronic component including a second substrate and a plurality of second electrodes disposed at a second height from a surface of the second substrate, a second electrode overlapping with a corresponding first electrode to face the first electrode; a conductive bonding layer disposed between the first electrode and the second electrode overlapped with each other to bond the first electrode and the second electrode; and at least one spacer disposed between the first substrate and the second substrate to overlap the pressed area, the at least one spacer having a thickness that is greater than a value obtained by summing the first height and the second height.

20 Claims, 16 Drawing Sheets

(51) Int. Cl.
*H01L 23/00* (2006.01)
*H05K 1/02* (2006.01)
*H05K 3/36* (2006.01)
*H05K 3/32* (2006.01)

(52) U.S. Cl.
CPC .............. *H01L 24/81* (2013.01); *H01L 24/83* (2013.01); *H01L 24/92* (2013.01); *H05K 1/028* (2013.01); *H05K 1/111* (2013.01); *H05K 3/323* (2013.01); *H05K 3/363* (2013.01); *H01L 2224/16227* (2013.01); *H01L 2224/16238* (2013.01); *H01L 2224/32225* (2013.01); *H01L 2224/73204* (2013.01); *H01L 2224/81007* (2013.01); *H01L 2224/81193* (2013.01); *H01L 2224/81201* (2013.01); *H01L 2224/81801* (2013.01); *H01L 2224/83007* (2013.01); *H01L 2224/83201* (2013.01); *H01L 2224/92125* (2013.01); *H05K 1/147* (2013.01); *H05K 2201/042* (2013.01); *H05K 2201/10128* (2013.01); *H05K 2201/2036* (2013.01); *H05K 2203/0278* (2013.01)

(58) Field of Classification Search
CPC ............ H05K 1/03; H05K 1/05; H05K 1/053; H05K 1/056; H05K 2201/0738; H05K 1/0277; H05K 1/0278; H05K 1/028; H05K 1/0281; H01L 24/50
See application file for complete search history.

(56) References Cited

U.S. PATENT DOCUMENTS

| | | | | |
|---|---|---|---|---|
| 2010/0001411 | A1* | 1/2010 | Sawada | H01L 24/11 257/778 |
| 2012/0118480 | A1* | 5/2012 | Paik | C09J 5/06 156/73.1 |
| 2014/0138706 | A1 | 5/2014 | Yoneyama et al. | |
| 2016/0352031 | A1* | 12/2016 | Ito | H01R 4/04 |
| 2017/0062379 | A1* | 3/2017 | Zhang | H01L 24/83 |

FOREIGN PATENT DOCUMENTS

KR  10-0650728  11/2006
KR  10-2015-0084329  7/2015

* cited by examiner

BONDED ASSEMBLY AND DISPLAY DEVICE INCLUDING THE SAME

CROSS-REFERENCE TO RELATED APPLICATION

This application claims priority from and the benefit of Korean Patent Application No. 10-2016-0109217, filed on Aug. 26, 2016, which is hereby incorporated by reference for all purposes as if fully set forth herein.

BACKGROUND

Field

Exemplary embodiments relate to a bonded assembly and a display device including the same.

Discussion of the Background

Many electronic components are used for electronic products, such as display devices, smart phones, tablets, televisions, and monitors, and development of electronic packaging techniques for systematizing the electronic components for mutual organic and optimized functions thereof is desired.

The electronic packaging techniques may serve to protect each component constituting products, as well as the products themselves, from the external environment. The electronic packaging techniques may also serve to supply power to necessary elements, may provide smooth paths of electrical signals, and may serve to dissipate heat generated in signal processing operations.

Various electronic packaging techniques are used to configure various components in a limited space of a product. To connect modules with each other, connection techniques between printed circuit boards, or between a printed circuit board and an electronic component such as an integrated circuit chip, are required. Further, it is important to acquire and maintain connection reliability between components.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a bonded assembly and a display device using the same that are capable of having improved connection reliability.

Additional aspects will be set forth in the detailed description which follows, and, in part, will be apparent from the disclosure, or may be learned by practice of the inventive concept.

An exemplary embodiment discloses a bonded assembly including: a first electronic component including a first substrate and a plurality of first electrodes disposed in a pressed area at a first height from a surface of the first substrate; a second electronic component including a second substrate and a plurality of second electrodes disposed at a second height from a surface of the second substrate, the second electronic component being disposed on the first electronic component such that a second electrode overlaps a corresponding first electrode and faces the first electrode; a conductive bonding layer disposed between the first electrode and the second electrode and configured to bond the first electrode and the second electrode; and at least one spacer disposed between the first substrate and the second substrate to overlap the pressed area, the at least one spacer having a thickness that is greater than a sum of the first height and the second height.

The at least one spacer may include a plurality of spacers that are separated from each other.

The spacers may overlap four edges of the pressed area.

The plurality of spacers may overlap four sides of the pressed area.

A distance between adjacent spacers may be greater than a distance between adjacent first electrodes or adjacent second electrodes.

The at least one spacer may be attached, printed, or deposited on at least one of the first substrate and the second substrate.

The spacer may have a melting point of about 200° C. or more.

The bonded assembly may further include an anisotropic conductive layer disposed between the first substrate and the second substrate, and the anisotropic conductive layer may include solder particles.

The bonded assembly may further include a non-conductive layer disposed between the first substrate and the second substrate.

The at least one spacer may surround the first electrodes and the second electrodes.

The bonded assembly may further include at least one spacer disposed to not overlap an edge of the pressed area in the pressed area.

At least one of the first electronic component and the second electronic component may be a flexible printed circuit board.

An exemplary embodiment also discloses a display device including a display panel and a bonded assembly connected to the display panel, wherein the bonded assembly includes: a first flexible printed circuit board including a first substrate and a plurality of first electrodes disposed in a pressed area at a first height from a surface of the first substrate; a second flexible printed circuit board including a second substrate and a plurality of second electrodes disposed at a second height from a surface of the second substrate, the second flexible printed circuit board being disposed on the first flexible printed circuit board such that a second electrode overlaps a corresponding first electrode and faces the first electrode; a conductive bonding layer disposed between the first electrode and the second electrode and configured to bond the first electrode and the second electrode; and at least one spacer disposed between the first substrate and the second substrate to overlap the pressed area, the at least one spacer having a thickness that is greater than a sum of the first height and the second height.

According to the exemplary embodiments, in an assembly that is bonded using a conductive bonding layer, such as a solder, and a display device including the assembly, it is possible to reduce the resistance between connection electrodes, as well as the risk of generating a short-circuit between adjacent electrodes.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
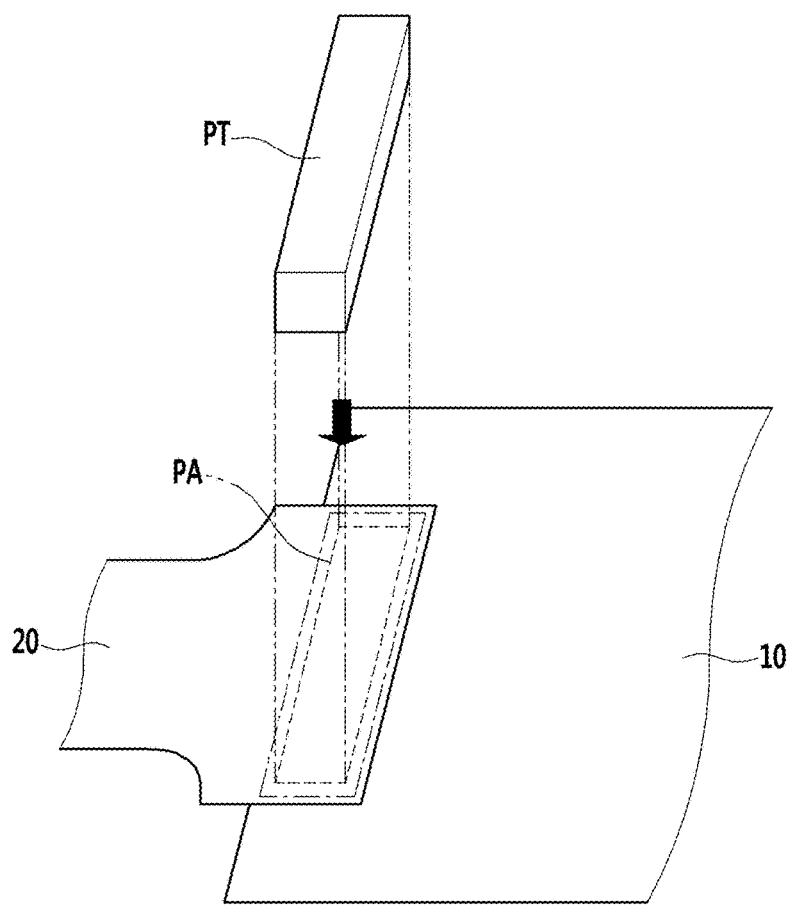
FIG. 1 is a perspective view schematically illustrating a bonded assembly according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A bonded assembly according to an exemplary embodiment of the present invention will be described with reference to the accompanying drawings.

Figure 2:
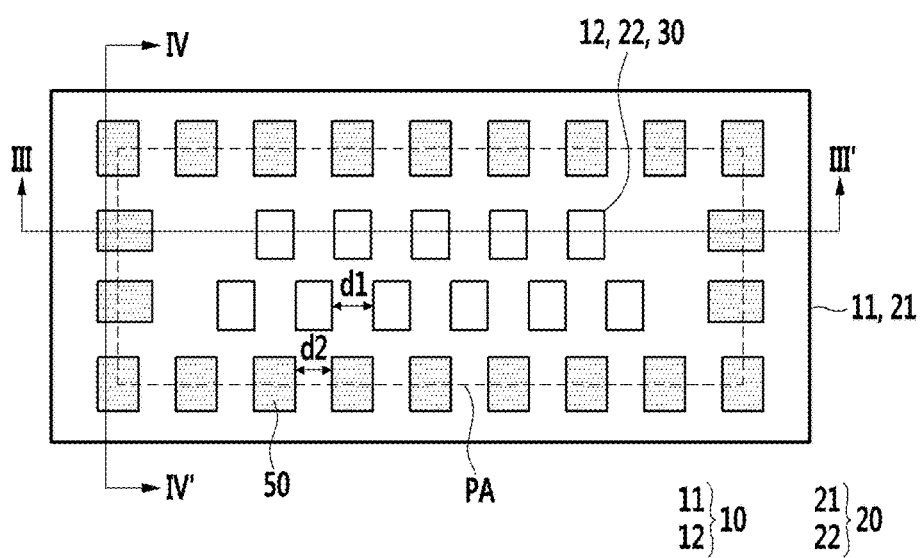
FIG. 2 is a top plan view illustrating a region indicated by a one-point chain line in FIG. 1 according to an exemplary embodiment.
Figure 3:
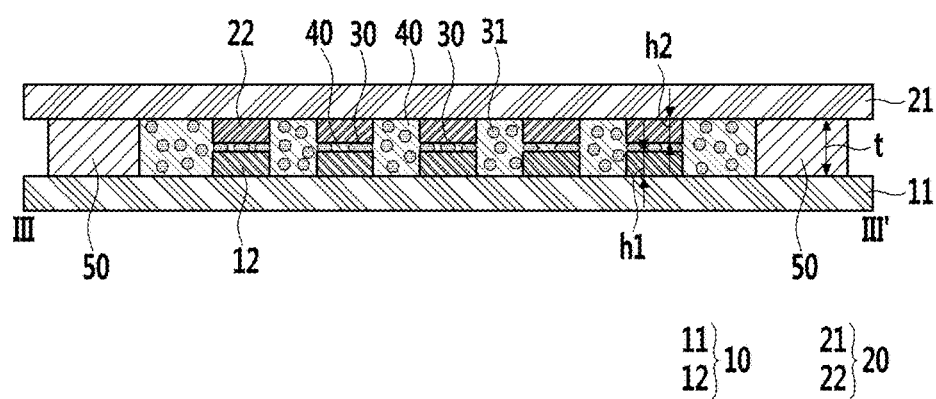
FIG. 3 is a cross-sectional view taken along the line III-III' in FIG. 2 according to an exemplary embodiment.

FIG. 1 schematically illustrates a bonded assembly according to an exemplary embodiment of the present invention, and FIG. 2 is a top plan view illustrating a region indicated by a one-point chain line in FIG. 1 according to an exemplary embodiment. FIG. 3 is a cross-sectional view taken along the line III-III' in FIG. 2 according to an exemplary embodiment, and FIG. 4 is a cross-sectional view taken along the line IV-IV' in FIG. 2 according to an exemplary embodiment.

Referring to FIG. 1, the bonded assembly according to the present exemplary embodiment includes a first electronic component 10 and a second electronic component 20 that are bonded to each other. When the first electronic component 10 and the second electronic component 20 are bonded to each other, specific pressed areas PA thereof are first pressed by a pressing tool PT of a bonding machine. When being pressed by the pressing tool PT, the pressed area PA of the first electronic component 10 or the second electronic component 20 contacts a pressed surface of the pressing tool PT such that the first electronic component 10 or the second electronic component 20 is directly pressed by the pressing tool PT. Accordingly, the pressed area PA has a shape corresponding to a planar shape of the pressed surface of the pressing tool PT, which may be substantially rectangular. A bonding area to which the first electronic component 10 and the second electronic component 20 are actually bonded by pressure and heating corresponds to the pressed area PA, but sizes thereof may be different from each other.

The first electronic component 10 may be a printed circuit board (PCB), and the second electronic component 20 may also be a PCB. Both of the first electronic component 10 and the second electronic component 20 may be a flexible PCB, or the first electronic component 10 may be a rigid PCB and the second electronic component 20 may be a flexible printed circuit board. At least one of the first and second electronic components 10 and 20 may be an electronic component that is different from the printed circuit board. For example, the second electronic component 20 may be an integrated circuit chip mounted on the first electronic component 10, which may be a flexible or rigid printed circuit board or display panel. The first and second electronic components 10 and 20 may be any electronic components that may include electrodes and may be bonded to each other by heating and pressure.

Figure 4:
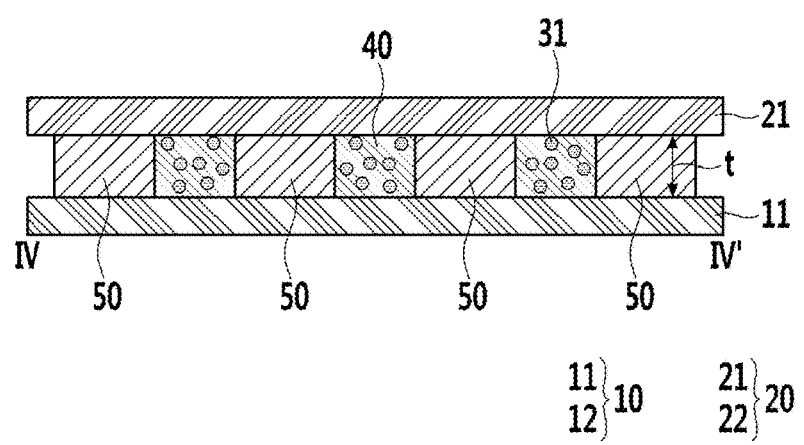
FIG. 4 is a cross-sectional view taken along the line IV-IV' in FIG. 2 according to an exemplary embodiment.

FIG. 2 illustrates a planar shape of the first and second electronic components 10 and 20 including the pressed areas PA, and FIG. 3 and FIG. 4 illustrate cross-sectional views thereof.

Referring to FIG. 2 and FIG. 3, the first electronic component 10 includes a first substrate 11 and first electrodes 12 disposed thereon, and the second electronic component 20 includes a second substrate 21 and second electrodes 22 disposed thereon.

When the first electronic component 10 is a printed circuit board, the first substrate 11 may be a plastic board or a film. When the first electronic component 10 is an integrated circuit chip, the first substrate 11 may be a silicon substrate. Similarly, when the second electronic component 20 is a printed circuit board, the second substrate 21 may be a plastic board or a film. When the second electronic component 20 is an integrated circuit chip, the second substrate 21 may be a silicon substrate. The first and second electrodes 12 and 22 are respectively formed to protrude from surfaces of the first and second substrates 11 and 21 at predetermined heights h1 and h2. The height h1 of the first electrodes 12 may be substantially the same as or different from the height h2 of the second electrodes 22. The first and second electrodes 12 and 22 are disposed within the pressed area PA. Accordingly, an area confined by the first electrodes 12 may be positioned within the pressed area PA, and an area confined by the second electrodes 22 may be positioned within the pressed area PA.

Herein, the surfaces of the substrate 11 and 21 indicate not only surfaces of a plastic board, a film, or the like, but also a surface of an insulating layer or the like, which is exposed to the outside, formed on a surface of the plastic board, the film, or the like. Accordingly, the surfaces of the substrates 11 and 21 may indicate surfaces portions at which the electrodes 12 and 22 are not disposed.

The first electrodes 12 and the second electrodes 22 serve as external ports that are respectively connected with different electronic components to transfer or receive signals. Such electrodes may be variously referred to as pads, pad electrodes, electrode pads, terminal electrodes, electrode terminals, or bumps. The first electrodes 12 and the second electrodes 22 may be connected with wires (not illustrated) formed in the first electronic component 10 and the second electronic component 20.

The first electrodes 12 and the second electrodes 22, which are disposed to face each other, are illustrated to be completely identically overlapped with each other as single electrodes. However, the first electrodes 12 and the second electrodes 22 may be misaligned from each other, and may have different sizes and/or shapes. Each of the first electrodes 12 and the second electrodes 22 may have various planar shapes, such as polygonal, circular, and elliptical, as well as quadrangular. For example, the first electrodes 12 and the second electrodes 22 may be disposed in two lines, as shown in FIG. 2. However, the first electrodes 12 and the second electrodes 22 may be disposed in one line or in three or more lines, and the number of first electrodes 12 may be different from that of the second electrodes 22.

A conductive bonding layer 30 is disposed between the first electrode 12 and the second electrode 22. The conductive bonding layer 30 serves to bond and electrically connect the first electrode 12 with the second electrode 22. The conductive bonding layer 30 may be formed of a solder which is an alloy used for bonding two metals. Hereinafter, the solder will be described as a material of the conductive bonding layer 30. The conductive bonding layer 30 may be formed by melting the solder with heat generated together with the pressure and then rigidifying it. The first electrode 12 and the second electrode 22 are connected with each other by using metallurgical bonding by the conductive bonding layer 30 instead of physical point contact by a conductive ball obtained by coating a metal layer on a surface of a resin.

The solder that may be used for forming the conductive bonding layer 30 may be formed of any material that has a predetermined temperature that is lower than melting points of the first and second electrodes 12 and 22 and adhesiveness with the first and second electrodes 12 and 22. For example, the solder may be formed of a tin-lead (Sn—Pb) alloy, a tin-bismuth (Sn—Bi) alloy, and a tin-silver-copper (Sn—Ag—Cu) alloy, and may have a melting point that is about 200° C. or less, or about 300° C. or less. In the drawing, the conductive bonding layer 30 is illustrated to be disposed between opposite surfaces of the first and second electrodes 12 and 22, but may be disposed in side surfaces of the first and second electrodes 12 and 22. The conductive bonding layer 30 may be discontinuously or continuously formed between the first and second electrodes 12 and 22 disposed to face each other.

Spacers 50 are disposed at an edge of the pressed area PA in the vicinity of the first and second electrodes 12 and 22. The spacers 50 are disposed to overlap the edge of the pressed area PA between the first electronic component 10 and the second electronic component 20, particularly between the first substrate 11 and the second substrate 21. When the first substrate 11 and the second substrate 21 are pressed by the pressing tool PT, the spacers 50 are disposed to overlap the edge of the pressed surface and serve to separate the first substrate 11 and the second substrate 21 from each other by a thickness "t" of the spacers 50. The thickness of the spacers 50 may be greater than a value obtained by summing a height h1 of the first electrode 12 and a height h2 of the second electrode 22. Accordingly, a gap t-h1-h2 can be obtained between the first and second electrodes 12 and 22 disposed to face each other. However, when the thickness t of the spacers 50 is too thick, the first and second electrodes 12 and 22 facing each other may not be bonded to each other. Accordingly, the thickness t of the spacers 50 may be less than a value obtained by adding a thickness of the conductive bonding layer 30 to the height h1 of the first electrode 12 and the height h2 of the second electrode 22.

As shown therein, the spacers 50 may have a quadrangular planar shape, or may have various planar shapes, such as polygonal, circular, and elliptical planar shapes. The spacers 50 disposed at an edge of the pressed area PA have substantially the same sizes, and distances d2 between adjacent spacers 50 may be substantially the same or may be different.

The spacers 50 may be formed of a material that is not melted or modified by heat applied when bonding is performed. For example, the spaces 50 may be formed of a material having a melting point that is in a range of about 200° C. or greater, 250° C. or greater, or 300° C. or greater. The spacers 50 may be pre-formed and may be attached to the first substrate 11 and/or the second substrate 21, or may be directly formed on the first substrate 11 and/or the second substrate 21 by printing, evaporation, or the like. The spacers 50 may be separated from the first and second electrodes 12 and 22 such that they are not overlapped with the first and second electrodes 12 and 22.

Even though the first substrate 11 and the second substrate 21 and the pressed surface of the pressing tool PT are designed to be flat, they may not be made to be completely flat. Accordingly, when the first substrate 11 and the second substrate 21 are pressed by the pressing tool PT, one of the first substrate 11 and the second substrate 21 may be unintentionally pressed further in the pressed area PA. In the further-compressed area, the solder of the conductive bonding layer 30 which needs to be disposed between the first substrate 11 and the second substrate 21 facing each other may be pushed to contact an adjacent electrode, thereby generating a short-circuit, or increasing contact resistance between the first substrate 11 and the second substrate 21. In the present exemplary embodiment, the spacers 50 are disposed to overlap the edge of the pressed area PA. Accordingly, even if any portion is over-pressed due to unideal flatness of the first substrate 11, the pressed surface of the pressing tool PT, and/or the like, the first substrate 11 and the second substrate 21 may be prevented from being pressed such that the distance therebetween is equal to or less than the thickness of the spacers 50. When the thickness of the spacers 50 is greater than the sum of the heights h1 and h2 of the first and second electrodes 12 and 22, a gap between the first and second electrodes 12 and 22 can be secured regardless of whether they are over-pressed. Accordingly, a conductive bonding layer 30 having a predetermined thickness remains in the gap. Accordingly, the conductive bonding layer 30 can serve to stably bond the first and second electrodes 12 and 22, thereby reducing a possibility of short-circuit with adjacent electrodes.

When the spacers 50 are disposed at all four edges of the pressed area PA, four edges of the pressed surface of the pressing tool PT are supported by the spacers 50. Accordingly, it is possible to prevent the pressing tool PT from producing inclined pressure to any one side. Similarly, even when the spacers 50 are disposed to overlap all four edges of the pressed area PA, it is possible to prevent the pressing tool PT from producing inclined pressure to any one side. Accordingly, it is possible to generally and more uniformly adjust the distance between the first substrate 11 and the second substrate 21 while preventing short-circuit generation or an increase in contact resistance caused by over-pressure or non-uniform pressure. Thus, it is possible to reduce variation in quantity and thickness of conductive bonding layers 30 disposed between pairs of electrodes 12 and 22 in the pressed area PA.

An adhesive layer 40 is also disposed between the first substrate 11 and the second substrate 21. The adhesive layer 40 may fill a space between the first substrate 11 and the second substrate 21 that is not occupied by the first and second electrodes 12 and 22 and the conductive bonding layers 30. The adhesive layer 40 may be disposed between discontinuous conductive bonding layers 30 disposed between the first and second electrodes 12 and 22 facing each other. In other words, the adhesive layer 40 may be disposed between the first and second electrodes 12 and 22, together with the conductive bonding layers 30. The adhesive layer 40 serves to bond the first electronic component 10 and the second electronic component 20 to increase a bonding force therebetween. The adhesive layer 40 may be disposed to surround the first and second electrodes 12 and 22 and the conductive bonding layers 30 to contribute to the prevention of oxidation of these layers.

Solder particles 31 are included in the adhesive layer 40 between adjacent first electrodes 12 and between adjacent second electrodes 22. The solder particles 31 are solder particles that do not constitute the conductive bonding layers between the first and second electrodes 12 and 22 among solder particles included in the adhesive layer 40. Accordingly, the solder particles 31 are formed of a material that is the same as that of the conductive bonding layers 30. The solder particles 31 may have a spherical shape, but the shape of the solder particles 31 may be modified or they may be aggregated. The adhesive layer 40 and the solder particles 31 are mainly disposed in the pressed area PA. However, as shown in FIG. 4, the adhesive layer 40 and the solder particles 31 may be disposed between adjacent spacers 50, and may also be disposed in the pressed area PA.

Hereinafter, a bonded assembly according to an exemplary embodiment of the present invention will be described based on a difference with the aforementioned exemplary embodiment.

Figure 5:
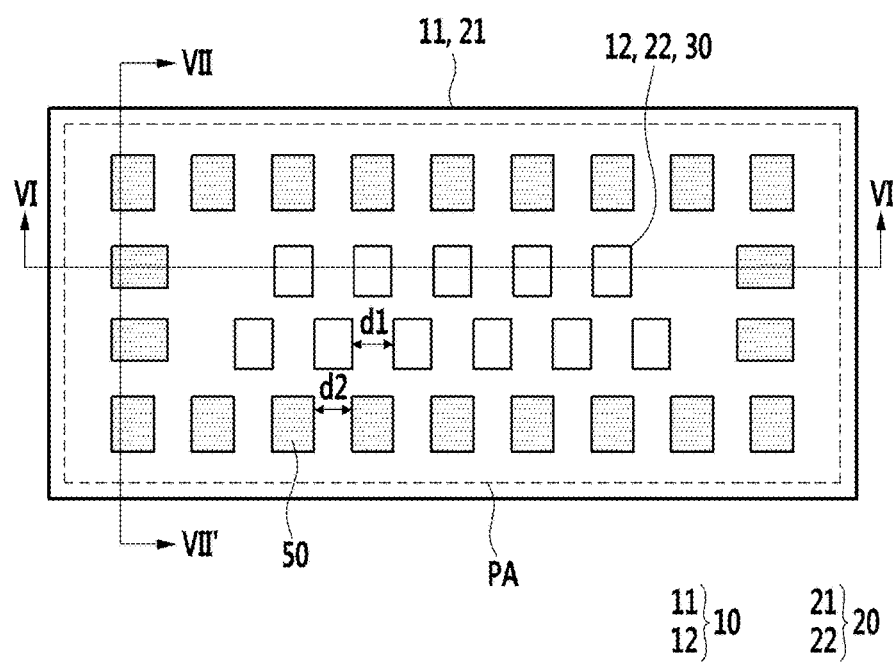
FIG. 5 is a top plan view illustrating a region indicated by a one-point chain line in FIG. 1 according to an exemplary embodiment.
Figure 6:
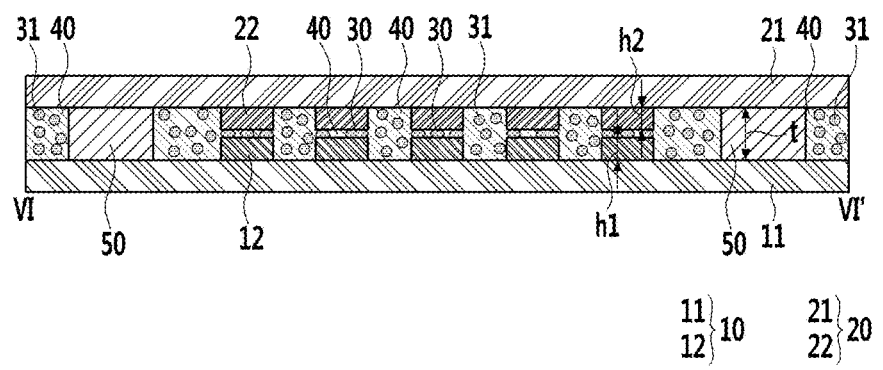
FIG. 6 is a cross-sectional view taken along the line VI-VI' in FIG. 5 according to an exemplary embodiment.
Figure 7:
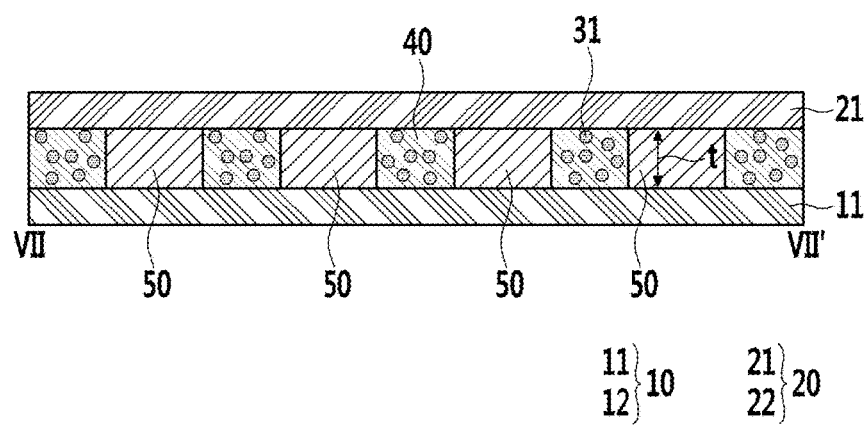
FIG. 7 is a cross-sectional view taken along the line VII-VII' in FIG. 5 according to an exemplary embodiment.

FIG. 5 is a top plan view illustrating a region indicated by a one-point chain line in FIG. 1 according to an exemplary embodiment. FIG. 6 is a cross-sectional view taken along the line VI-VI' in FIG. 5 according to an exemplary embodiment. FIG. 7 is a cross-sectional view taken along the line VII-VII' in FIG. 5 according to an exemplary embodiment.

Referring to FIG. 5, as in the aforementioned exemplary embodiment of FIG. 2, the first and second electrodes 12 and 22 are disposed in the pressed area PA, and the spacers 50 are disposed around the second electrodes 12 and 22. However, the spacers 50 are disposed in the pressed area PA differently from the exemplary embodiment of FIG. 2 in which the spacers 50 are disposed at an edge of the pressed area PA. Even so, the spacers 50 are disposed to overlap the pressed area PA. Accordingly, when they are pressed by the pressing tool PT, a distance between the first substrate 11 and the second substrate 21 may be separated from the thickness of the spacers 50, and it is possible to prevent inclined pressure caused by the pressing tool PT to any one side. Unlike in the illustrated exemplary embodiment, some spacers 50 may be disposed to overlap at least one edge of the pressed area PA.

Referring to FIG. 6 and FIG. 7, the adhesive layer 40 including the solder particles 31 is disposed between the spacers 50 and the first and second electrodes 12 and 22, and between adjacent spacers 50. The adhesive layer 40 may also be disposed in an outer circumference of the spacers 50. Accordingly, the adhesive layer 40 may be disposed to completely surround the respective spacers 50, and thus, a bonding force between the first and second electronic components 10 and 20 may be increased around the spacers 50.

Until now, the bonded assembly according to the exemplary embodiment of the present invention has been described based on a structural property thereof. Hereinafter, a manufacturing method of the bonded assembly will be described with reference to FIG. 8 and FIG. 9.

Figure 8:
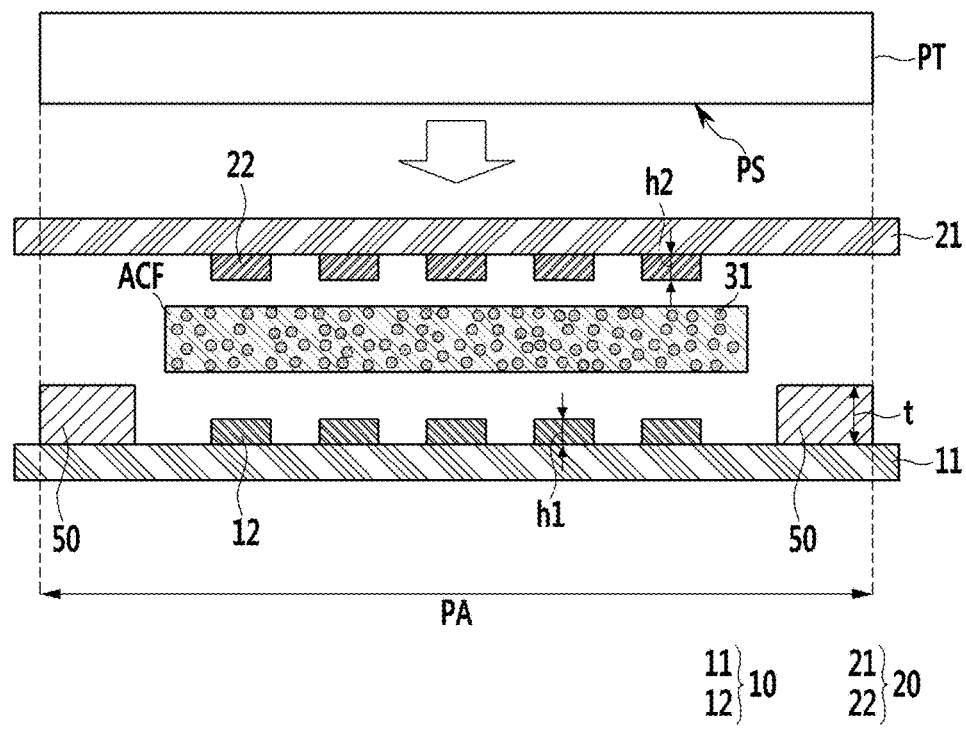
FIG. 8 is a process cross-sectional view illustrating a method of manufacturing the bonded assembly in FIG. 3.

FIG. 8 is a process cross-sectional view illustrating a method of manufacturing the bonded assembly in FIG. 3.

Referring to FIG. 8, the first electrodes 12 of the first electronic component 10 are disposed to face the top in a supporting plate (not illustrated) and the like of the bonding machine. In FIG. 8, the first electrodes 12 of the first electronic component 10 may be formed on the first substrate 11 at the height h1. The spacers 50 having the thickness t are formed or attached at portions of the first substrate 11 which are overlapped with the pressed area PA corresponding to a pressed surface PS of the pressing tool PT.

Next, an anisotropic conductive layer ACF in which the solder particles 31 are dispersed in a resin is disposed on the first electronic component 10. For example, the anisotropic conductive layer ACF may be disposed to overlap the first electrodes 12 without being overlapped with the spacers 50. To that end, an anisotropic conductive layer having a release paper attached thereto may be cut to a predetermined size and then the release paper may be removed therefrom, and they may be used as anisotropic conductive layers ACF. As the resin of the anisotropic conductive layer ACF, a thermosetting resin such as an epoxy resin, an acryl resin, a polyester resin, a bismaleimide resin, and a cyanate resin may be employed, and the resin of the anisotropic conductive layer ACF may be in a semi-cured state. The resin may be a photo-curable resin. The solder particles 31 may have a diameter that is about 50 μm or less, or a diameter that is in a range of about 1 μm to about 25 μm. The solder particles 31 may be formed of an alloy including tin (Sn), lead (Pb), bismuth (Bi), silver (Ag), or copper (Cu), but the alloy is not limited thereto.

Successively, the second electrodes 22 of the second electronic component 20 are disposed on the anisotropic conductive layer ACF such that the anisotropic conductive layer ACF is interposed between the first electronic component 10 and the second electronic component 20. The second electrodes of the second electronic component 20 may be formed on the second substrate 21 at the height h2. Next, when the pressed area PA is heated while being pressed by the pressing tool PT, the solder particles 31 of the anisotropic conductive layer ACF disposed between the first and second electrodes 12 and 22, which are overlapped with each other, may be melted, so their forms may be changed between the first and second electrode 12 and 22, or adjacent solder particles may be attached to each other or dispersed while their forms are changed, and some of the solder particles may flow out to the periphery of the first and second electrodes 12 and 22. Even so, since the gap (t-h1-h2) may exist between the first and second electrodes 12 and 22 due to the spacers 50 disposed between the first and second substrates 11 and 21, melted solder particles may remain between the first and second electrodes 12 and 22, and a possibility of melted solder particles being connected to adjacent electrodes 12 and 22 that need to be insulated therefrom is reduced.

In the pressure and heating of the pressed area PA, the resin of the anisotropic conductive layer ACF fills spaces formed between adjacent electrodes 12 and 22, and is cured by heat or the like. The remaining resin is also cured together with the solder particles melted between the first and second electrode 12 and 13. The resin remaining after filling spaces of the pressed area PA that are separately formed at a predetermined interval flows to the outside of the pressed area PA when being pressed. In this case, referring to FIG. 2, the spaces 50 may be separately disposed at a predetermined distance d2 such that the resin smoothly flows. The distance d2 between adjacent spacers 50 may be substantially the same as or greater than the distance d1 between adjacent first electrodes 12 or second electrodes 22. When the distance d2 is less than the distance d1, a flow rate of the resin between the electrodes 12 and 22 may be different from that of the resin between the spacers 50, thereby deteriorating uniformity of the adhesive layer 40, and thus, the bonding may be deteriorated. Having substantially the same size of the spaces 50 is also advantageous in acquiring flow uniformity of the resin. The solder particles 31 that are not disposed between the first and second electrodes 12 and 22 may be partially melted and thus, modified or maintained in their original shapes (e.g., spherical).

For example, a pressing tool PT that can be heated may be used for heating the pressed area PA. Alternatively, the heating may be performed by directly irradiating a laser or the like to the anisotropic conductive layer ACF, or may be automatically performed in the anisotropic conductive layer ACF by vibration using ultrasonic waves. When curing the resin of the anisotropic conductive layer ACF, light, such as ultraviolet rays, may be irradiated while under pressure.

Finally, the solder particles 31 melted between the first and second electrodes 12 and 22 are hardened to the conductive bonding layer 30 having, e.g., a flattened form compared with the solder particles before being melted, a form in which adjacent solder particles are attached to each other, or a mixed form thereof, in order to bond the first and second electrodes 12 and 22. The cured resin serves as the adhesive layer 40 which attaches the first electronic component 10 and the second electronic component 20. As described above, for example, the spacers 50 are disposed on the first substrate 11 at an initial step (i.e., before bonding of the first and second electronic components 10 and 20). However, the spacers 50 may be disposed on the second substrate 21. Alternatively, some of the spacers 50 may be disposed on the first substrate 11, and the others may be disposed on the second substrate 21.

Figure 9:
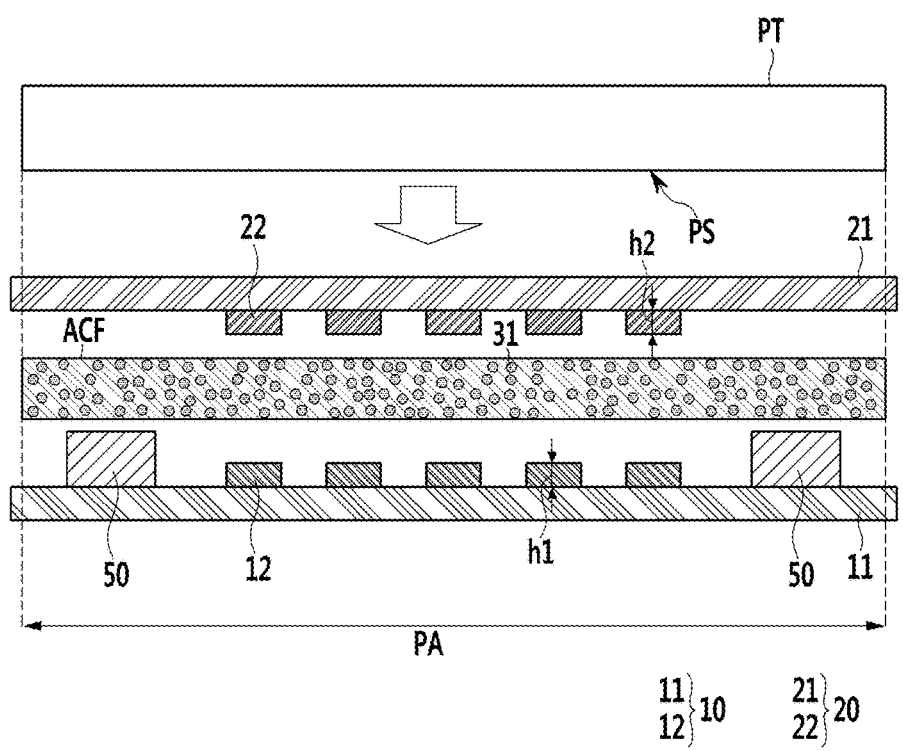
FIG. 9 is a process cross-sectional view illustrating a method of manufacturing the bonded assembly in FIG. 5.

FIG. 9 is a process cross-sectional view illustrating a method of manufacturing the bonded assembly in FIG. 5.

An exemplary embodiment of FIG. 9 is mostly the same as the exemplary embodiment of FIG. 8, except for a size and the like of the anisotropic conductive layer ACF. Specifically, in the exemplary embodiment of FIG. 9, the anisotropic conductive layer ACF is disposed to overlap the first electrodes 12 and the spacers 50. To this end, an anisotropic conductive layer having a release paper attached thereto may be cut to a predetermined size to enable removal of the release paper therefrom, and it may be used as the anisotropic conductive layers ACF, or an anisotropic conductive layer ACF in which the solder particles 31 are dispersed in a resin may be directly formed on the first electronic component 10.

The pressed area PA, which is pressed by the pressing tool PT, may have a size corresponding to the anisotropic conductive layer ACF. When the pressed area PA is smaller than the anisotropic conductive layer ACF, anisotropic conductive layers ACF that remain on the spacers 50 are not pressed, and thus, may remain on the spacers 50, and the resin of the anisotropic conductive layer ACF, which is positioned at an outer circumference of the pressed area PA, can remain in a non-cured state. This is because the spacers 50 may be disposed on the first substrate 11 at the initial stage as shown therein. Alternatively, the spacers 50 may be disposed on the second substrate 21, or may be disposed on the first and second substrates 11 and 21.

As described above, the anisotropic conductive layer ACF including the solder particles 31 may be used to form the bonded assembly by bonding the first electronic component 10 and the second electronic component 20, but other methods may be used. Hereinafter, other methods according to exemplary embodiments will be described with reference to FIG. 10 and FIG. 11, and FIG. 12 and FIG. 13, based on differences with the aforementioned exemplary embodiment.

Figure 10:
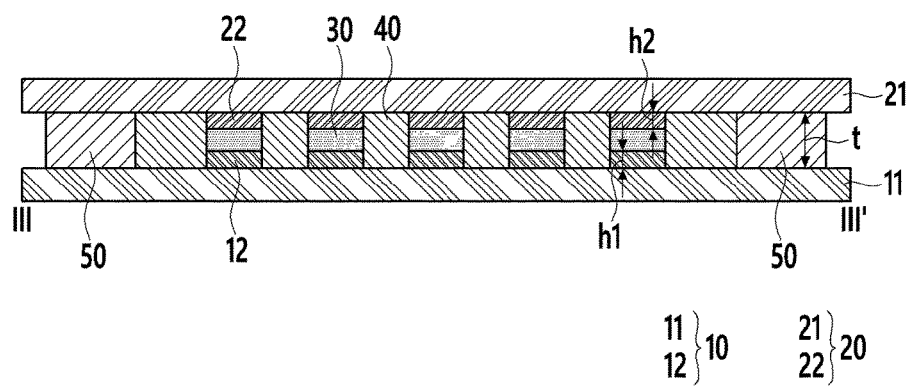
FIG. 10 is a cross-sectional view taken along the line III-III' in FIG. 2 according to an exemplary embodiment.
Figure 11:
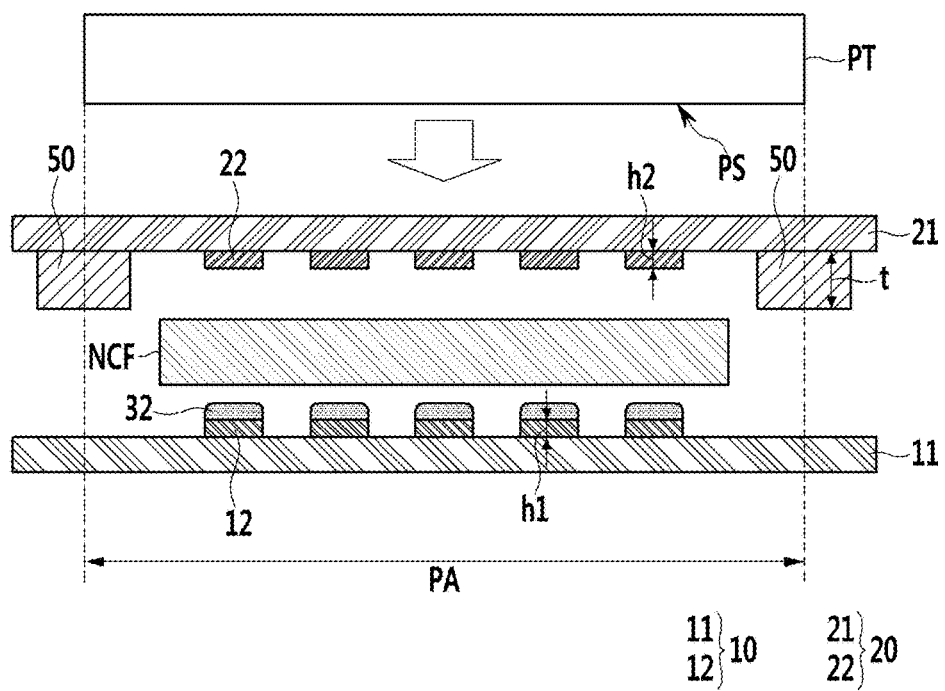
FIG. 11 is a process cross-sectional view illustrating a method of manufacturing the bonded assembly in FIG. 10.

FIG. 10 is a cross-sectional view taken along the line III-III' in FIG. 2 according to an exemplary embodiment, and FIG. 11 is a process cross-sectional view illustrating a method of manufacturing the bonded assembly in FIG. 10.

Referring to FIG. 10, as in the exemplary embodiment of FIG. 3, the first electronic component 10 and the second electronic component 20 are bonded to each other by the conductive bonding layer 30 and the adhesive layer 40. However, there is a difference in that the solder particles are not included in the adhesive layer 40. Further, the conductive bonding layer 30 is formed to be continuous, e.g., in a lump, between the first and second electrodes 12 and 22. Such a bonding structure may be formed by using a manufacturing method illustrated in FIG. 11, for example.

Referring to FIG. 11, the first electronic component 10 in which the first electrodes 12 are formed on the first substrate 11 at the height h1 is disposed in a supporting plate or the like. A solder coat 32 is formed on each of the first electrodes 12. The solder coat 32 may be formed by using various methods such as printing solder on the first electrodes 12 or soaking the first electrodes 12 in a solder solution.

Next, a non-conductive layer NCF that may be formed of an adhesive such as a resin without including solder particles or conductive particles is disposed on the first electronic component 10. The second electronic component 20 in which the second electrodes 22 are formed on the second substrate 21 at the height h2 is disposed on the non-conductive layer NCF such that the second electrodes 22 face the non-conductive layer NCF. The spacers 50 having the thickness t are formed or attached in a surface of the second substrate 21 which faces the first electronic component 10.

Next, when the pressed area PA is pressed by the pressing tool PT to be heated, the solder coat 32 disposed between the first and second electrodes 12 and 22 which are overlapped with each other is melted and then hardened to form the conductive bonding layer 30 which bonds the first and second electrodes 12 and 22. An amount of the solder coat 32 formed on each of the first electrodes 12 may be dispersed, and in the heating and pressure application, all or almost all of the solder coat 32 between the first and second electrodes 12 and 22 which are overlapped with each other may flow to the periphery of the first and second electrodes 12 and 22. In this case, an excess amount of solder coat 32 may flow to such a degree so as to contact electrodes 12 and 22 adjacent thereto from a portion at which the excess amount of solder coat 32 is formed. According to an exemplary embodiment of the present invention, by the action of the spacers 50 having the thickness t, a gap that may be formed between the first and second electrodes 12 and 22 which are overlapped with each other can receive some of the melted solder coat 32, thereby reducing a risk of short-circuit.

As described above, for example, the spacers 50 are disposed on the second substrate 21 at an initial step. However, the spacers 50 may be disposed on the first substrate 11 or on the first and second substrates 11 and 21. The solder coat 32 may be disposed on the second electrode 22 instead of being disposed on the first electrode 12, or may be disposed on both the first and second electrodes 12 and 22. A characteristic related to the resin of the non-conductive layer NCF may be the same as that of the resin of the aforementioned anisotropic conductive layer ACF, and a description thereof will be omitted.

Figure 12:
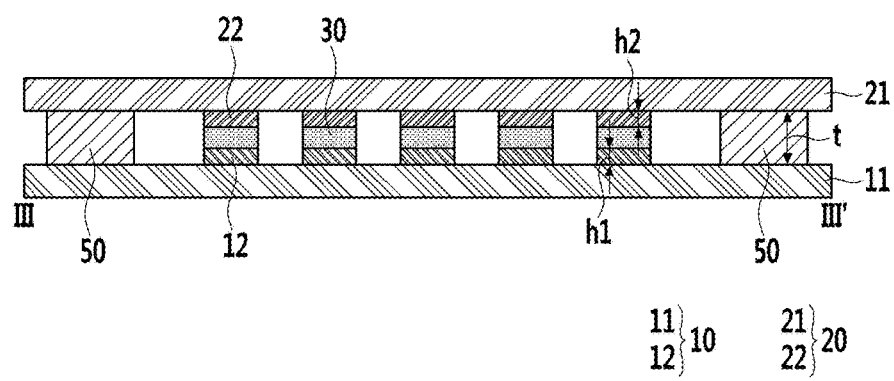
FIG. 12 is a cross-sectional view taken along the line III-III' in FIG. 2 according to an exemplary embodiment.
Figure 13:
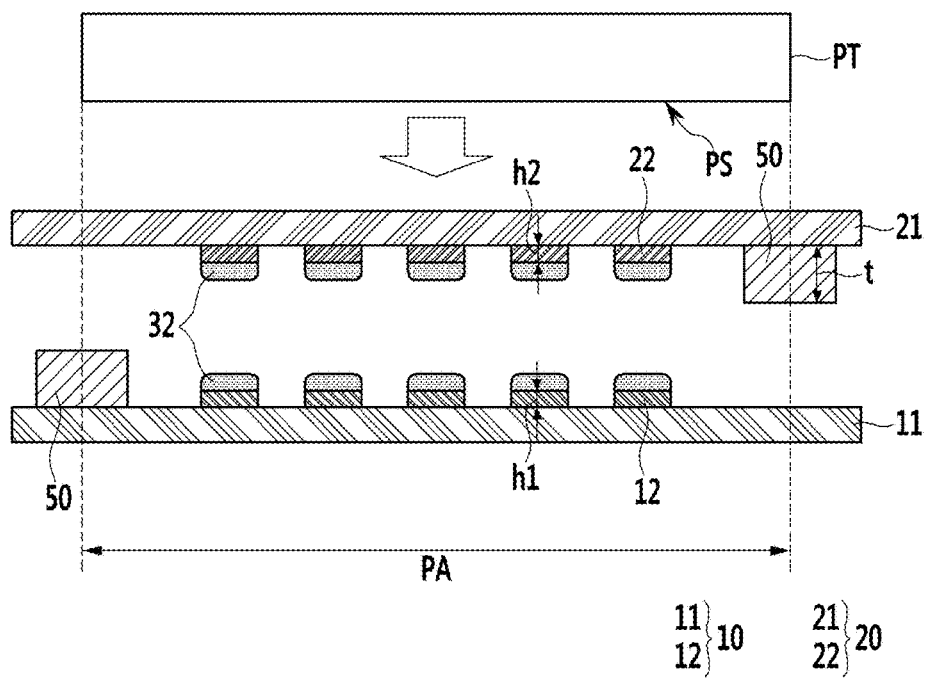
FIG. 13 is a process cross-sectional view illustrating a method of manufacturing the bonded assembly in FIG. 11.

FIG. 12 is a cross-sectional view taken along the line in FIG. 2 according to an exemplary embodiment, and FIG. 13 is a process cross-sectional view illustrating a method of manufacturing the bonded assembly in FIG. 11.

The exemplary embodiment of FIG. 12 is different from the exemplary embodiment of FIG. 10 in that no adhesive layer is formed between the first electronic component 10 and the second electronic component 20. The bonding of the two electronic components 10 and 20 may be performed by the conductive bonding layer 30. Accordingly, referring to FIG. 13, when the bonding between the first electronic component 10 and the second electronic component 20 is performed, no non-conductive layer NCF is formed therebetween, and the second electronic component 20 is directly disposed on the first electronic component 10. FIG. 13 illustrates that the solder coat 32 is formed on both the first electrode 12 and the second electrode 22 and the spacers 50 are formed on both the first substrate 11 and the second substrate 21. Alternatively, the solder coat 32 may be exclusively formed on the first electrode 12 or the second electrode 22, and the spacers 50 may be exclusively formed on the first substrate 11 or the second substrate 21.

Figure 14:
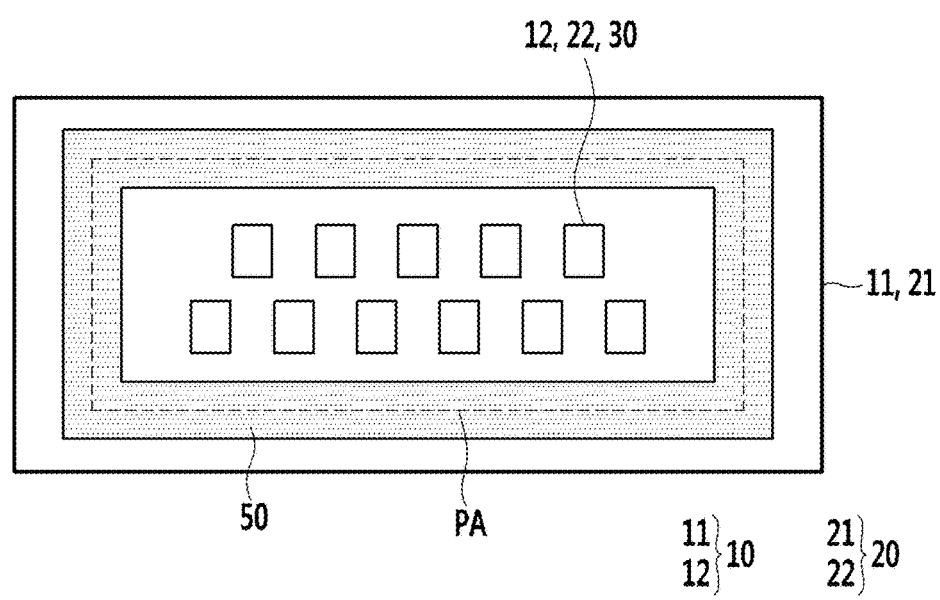
FIG. 14 is a top plan view illustrating a region indicated by a one-point chain line in FIG. 1 according to an exemplary embodiment.
Figure 15:
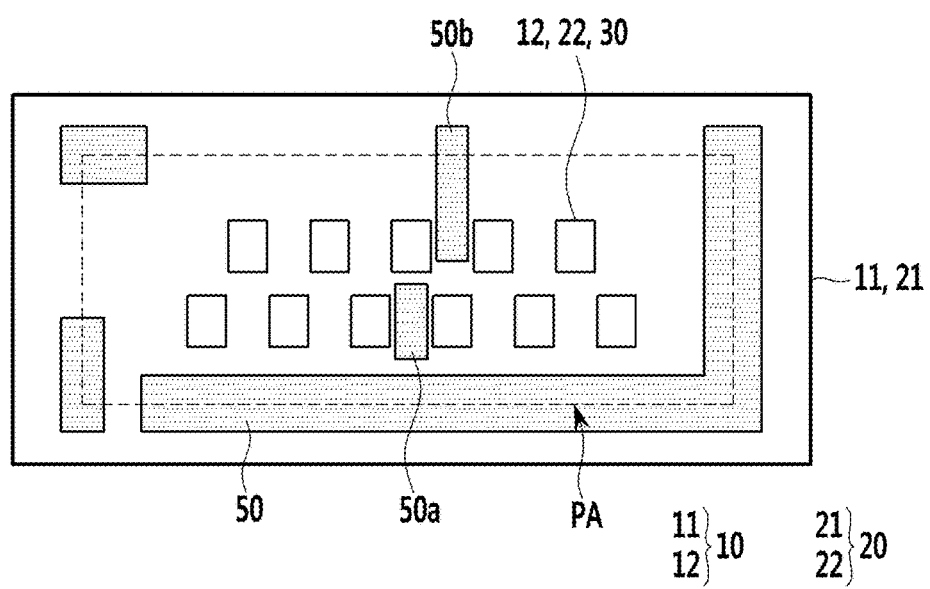
FIG. 15 is a top plan view illustrating a region indicated by a one-point chain line in FIG. 1 according to an exemplary embodiment.

FIG. 14 and FIG. 15 are top plan views respectively illustrating a region indicated by a one-point chain line in FIG. 1 according to an exemplary embodiment.

Referring to FIG. 14, one spacer 50 is disposed to surround the first and second electrodes 12 and 22 and to overlap an edge of the pressed area PA, differently from the exemplary embodiment of FIG. 2 in which the spacers 50 are separately disposed at the distance d2. Such spacer disposal may be applied to a case in which no adhesive layer is used, as in the exemplary embodiments of FIG. 12 and FIG. 13, for example. This is because, although the spacer 50 completely surrounds the pressed area PA, an adhesive such as a resin does not need to flow to the outside of the pressed area PA.

Referring to FIG. 15, the spacers 50 may be disposed in various sizes and shapes. For example, as illustrated therein, the spacers 50 may be disposed to overlap an edge of the pressed area PA like islands, or may be disposed across two sides of the pressed area PA. A spacer 50a may be disposed between the electrodes 12 and 22 adjacent to each other in the pressed area PA, and a spacer 50b may be disposed between the adjacent electrodes 12 and 22 from an edge of the pressed area PA. The spacers 50a and 50b may be used particularly when the pressed area PA is a wide area.

Until now, the bonded assembly in which two electronic components are bonded, and exemplary embodiments for manufacturing the bonded assembly, have been described. A display device as an example of a detailed electronic device to which such bonded assemblies are applied will now be described.

Figure 16:
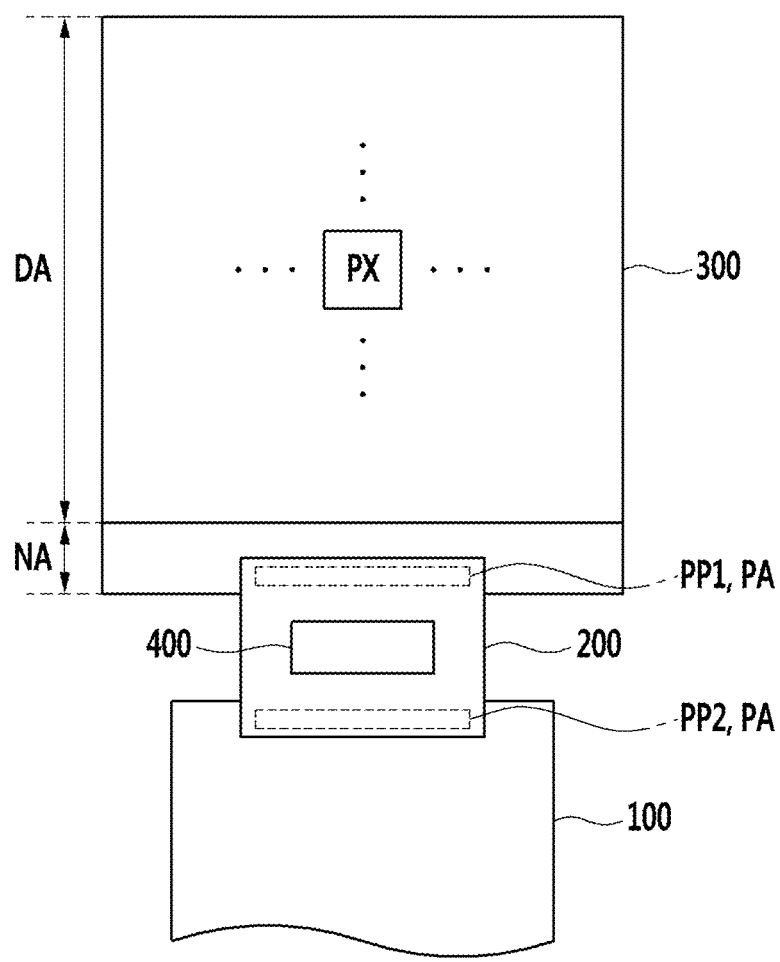
FIG. 16 schematically illustrates a bonded assembly according to an exemplary embodiment.

FIG. 16 schematically illustrates a bonded assembly according to an exemplary embodiment of the present invention.

Referring to FIG. 16, the display device according to the exemplary embodiment of the present invention includes a display panel 300 and flexible printed circuit boards 100 and 200 connected with the display panel 300. The display panel 300 may be an organic light emitting device panel or a liquid crystal panel, but is not limited thereto.

The display panel 300 includes a display area DA for displaying an image, and a non-display area NA outside the display area DA in which elements and wires for generating and/or transmitting various signals applied to the display area DA and/or wiring are disposed. In FIG. 16, although only one side edge region (e.g., a lower region) of the display panel 300 is shown as the non-display area NA, the other side edge regions (e.g., left and right edges and/or an upper edge) of the display panel 300 may be the non-display area NA. The display area DA is shown to be quadrangular, but it may be circular, oval, or polygonal.

Pixels PX are disposed, for example, in a matrix form in the display area DA of the display panel 300. Further, signal lines such as gate lines (not shown), data lines (not shown), and the like are disposed in the display area DA. The gate lines substantially extend in a first direction D1 (e.g., a row direction), and the data lines substantially extend in a second direction D2 (e.g., a column direction) crossing the first direction D1. Each pixel PX may be connected to a gate line and a data line to receive a gate signal and a data signal from these lines. In the case of an organic light emitting device, driving voltage lines (not shown), which is substantially extend, for example, in the second direction D2 to transmit a driving voltage to the pixels PX, may be disposed in the display area DA.

A pad portion PP1 at which electrodes for receiving signals from the outside of the display panel 300 is positioned in the non-display area NA of the display panel 300. One end of the flexible printed circuit 200 is connected to the pad portion PP1. The other end of the flexible printed circuit 200 may be connected with a pad portion PP2 of a flexible printed circuit board 100, and the flexible printed circuit board 100 may be connected with, e.g., an external rigid printed circuit board for transferring signals such as image data.

A driver for generating and/or processing various signals for driving the display panel 300 may be disposed in the non-display area NA of the display panel 300, the flexible printed circuit 200, or the external printed circuit board. The driver may include a data driver for applying a data signal to a data line, a gate driver for applying a gate signal to a gate line, a data driver, and a signal controller for controlling the data driver.

As illustrated therein, the data driver may be mounted in the flexible printed circuit board 200 in a form of an integrated circuit chip 400, and may be connected with the pad portion PP2 in a form of a tape carrier package (TCP). as Although not illustrated, the data driver may be mounted in a form of an integrated circuit chip in the non-display area NA between the display area DA and the pad portion PP1. The gate driver may be integrated in the non-display area (not shown) of left and/or right edges of the display panel 300, or may be provided as an integrated circuit chip. The signal controller may be formed as the integrated circuit chip 400, such as the data driver, or may be provided as a separate integrated circuit chip.

For example, the first and second electronic components 10 and 20 may respectively correspond to the aforementioned flexible printed circuit boards 100 and 200 of the display device, and the flexible printed circuit boards 100 and 200 may correspond to the aforementioned bonded assembly. All descriptions of individual characteristics of the first and second electronic components 10 and 20 and bonding characteristics thereof may be applied to the flexible printed circuit boards 100 and 200 as they are, and thus redundant descriptions thereof will be omitted. The first and second electronic components 10 and 20 may also respectively correspond to the display panel 300 and the flexible printed circuit board 200, or the flexible printed circuit board 200 and the integrated circuit chip 400. The pressed area PA of the first and second electronic components 10 and 20 may respectively correspond to the pad portion PP1 and PP2.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A bonded assembly comprising:
 a first electronic component comprising a first substrate and a plurality of first electrodes disposed in a pressed area at a first height from a surface of the first substrate;
 a second electronic component comprising a second substrate and a plurality of second electrodes disposed at a second height from a surface of the second substrate, the second electronic component being disposed on the first electronic component such that a second electrode overlaps a corresponding first electrode and faces the first electrode;
 a conductive bonding layer disposed between the first electrode and the second electrode and configured to bond the first electrode and the second electrode; and
 at least one spacer disposed between the first substrate and the second substrate to overlap the pressed area, the at least one spacer having a thickness that is greater than a sum of the first height and the second height,
 wherein:
 the pressed area has four sides; and
 at each position corresponding to each of the four sides of the pressed area, the at least one spacer comprises a plurality of spacers that are separated from each other.

2. The bonded assembly of claim 1, wherein the spacers overlap four edges of the pressed area.

3. The bonded assembly of claim 1, wherein the spacers overlap four sides of the pressed area.

4. The bonded assembly of claim 1, wherein a distance between adjacent spacers is greater than a distance between adjacent first electrodes or adjacent second electrodes.

5. The bonded assembly of claim 1, wherein the at least one spacer is attached, printed, or deposited on at least one of the first substrate and the second substrate.

6. The bonded assembly of claim 1, wherein the spacer has a melting point of about 200° C. or more.

7. The bonded assembly of claim 1, further comprising an anisotropic conductive layer disposed between the first substrate and the second substrate,
wherein the anisotropic conductive layer comprises solder particles.

8. The bonded assembly of claim 1, further comprising a non-conductive layer disposed between the first substrate and the second substrate.

9. The bonded assembly of claim 1, wherein the at least one spacer surrounds the first electrodes and second electrodes.

10. The bonded assembly of claim 1, further comprising at least one spacer disposed to not overlap an edge of the pressed area in the pressed area.

11. The bonded assembly of claim 1, wherein at least one of the first electronic component and the second electronic component comprises a flexible printed circuit board.

12. A display device comprising:
a display panel; and
a bonded assembly connected to the display panel,
wherein the bonded assembly comprises:
a first flexible printed circuit board comprises a first substrate and a plurality of first electrodes disposed in a pressed area at a first height from a surface of the first substrate;
a second flexible printed circuit board comprising a second substrate and a plurality of second electrodes disposed at a second height from a surface of the second substrate, the second flexible printed circuit board being disposed on the first flexible printed circuit board such that a second electrode overlaps a corresponding first electrode and faces the first electrode;
a conductive bonding layer disposed between the first electrode and the second electrode and configured to bond the first electrode and the second electrode; and
at least one spacer disposed between the first substrate and the second substrate to overlap the pressed area, the at least one spacer having a thickness that is greater than a sum of the first height and the second height,
wherein:
the pressed area has four sides; and
at each position corresponding to each of the four sides of the pressed area, the at least one spacer comprises a plurality of spacers that are separated from each other.

13. The bonded assembly of claim 12, wherein the spacers overlap four edges of the pressed area.

14. The display device of claim 12, wherein the spacers overlap four sides of the pressed area.

15. The display device of claim 12, wherein a distance between adjacent spacers is greater than a distance between adjacent first electrodes or adjacent second electrodes.

16. The display device of claim 12, wherein the spacer has a melting point of about 200° C. or more.

17. The display device of claim 12, wherein:
the bonded assembly further comprises an anisotropic conductive layer disposed between the first substrate and the second substrate; and
the anisotropic conductive layer comprises solder particles.

18. The display device of claim 12, wherein the bonded assembly further comprises a non-conductive layer disposed between the first substrate and the second substrate.

19. A bonded assembly comprising:
a first electronic component comprising a first substrate and a plurality of first electrodes disposed in a pressed area at a first height from a surface of the first substrate;
a second electronic component comprising a second substrate and a plurality of second electrodes disposed at a second height from a surface of the second substrate, the second electronic component being disposed on the first electronic component such that a second electrode overlaps a corresponding first electrode and faces the first electrode;
a conductive bonding layer disposed between the first electrode and the second electrode and configured to bond the first electrode and the second electrode; and
a spacer disposed between the first substrate and the second substrate to overlap the pressed area,
wherein:
the spacer has a thickness that is greater than a sum of the first height and the second height;
the spacer completely surrounds the plurality of first electrodes and the plurality of second electrodes; and
the spacer does not contact and does not overlap any one of the first and second electrodes.

20. The bonded assembly of claim 19, wherein the spacer completely surrounds the pressed area.

* * * * *